(12) United States Patent
Vigier et al.

(10) Patent No.: US 11,131,763 B2
(45) Date of Patent: Sep. 28, 2021

(54) PHASE PRESET FOR FAST CHIRP PLL

(71) Applicant: NXP USA, INC., Austin, TX (US)

(72) Inventors: Jean-Stephane Vigier, Mondonville (FR); Didier Salle, Toulouse (FR); Cristian Pavao-Moreira, Frouzins (FR); Julien Orlando, Toulouse (FR)

(73) Assignee: NXP USA, INC., Austin, TX (US)

( * ) Notice: Subject to any disclaimer, the term of this patent is extended or adjusted under 35 U.S.C. 154(b) by 233 days.

(21) Appl. No.: 16/426,638

(22) Filed: May 30, 2019

(65) Prior Publication Data

US 2019/0377076 A1 Dec. 12, 2019

(30) Foreign Application Priority Data

Jun. 6, 2018 (EP) ...................... 8305690

(51) Int. Cl.
| | | |
|---|---|---|
| *G01S 13/34* | (2006.01) | |
| *G01S 7/35* | (2006.01) | |
| *H03B 1/04* | (2006.01) | |
| *H03L 7/087* | (2006.01) | |
| *H03L 7/18* | (2006.01) | |
| *H03C 3/09* | (2006.01) | |
| *G01S 7/40* | (2006.01) | |

(52) U.S. Cl.
CPC .............. *G01S 13/343* (2013.01); *G01S 7/35* (2013.01); *G01S 7/4008* (2013.01); *G01S 13/34* (2013.01); *H03B 1/04* (2013.01); *H03C 3/0925* (2013.01); *H03C 3/0991* (2013.01); *H03L 7/087* (2013.01); *H03L 7/18* (2013.01)

(58) Field of Classification Search
CPC ........ G01S 13/343; G01S 13/345; G01S 7/35; G01S 7/4008; H03C 3/0925; H03C 3/095; H03C 3/0941; H03C 3/0991; H03C 3/0933; H03L 7/093; H03L 7/197; H03L 7/107
See application file for complete search history.

(56) References Cited

U.S. PATENT DOCUMENTS

| | | |
|---|---|---|
| 6,046,646 A | 4/2000 | Lo et al. |
| 6,515,553 B1 | 2/2003 | Filiol et al. |
| (Continued) | | |

OTHER PUBLICATIONS

U.S. Appl. No. 16/426,623, filed May 30, 2019, entitled "Boosted Return Time for Fast Chirp PLL and Calibration Method".

(Continued)

*Primary Examiner* — Ryan Johnson

(57) ABSTRACT

A fast chirp Phase Locked Loop with a phase preset includes a Voltage Controlled Oscillator, VCO, generating a Frequency Modulated Continuous Waveform, FMCW. The VCO responds to a filtered output voltage of a filter connected to a charge pump. A digital controller modifies the FMCW to generate a chirp phase and a return phase. The chirp phase includes a first linear change of the FMCW from a start frequency to a stop frequency. The return phase includes a second linear change of the FMCW from the stop frequency to the start frequency. A phase preset circuit connects to the digital controller and the filter. The phase preset circuit supplies a phase preset current during a start frequency time preceding the chirp phase. The phase preset current is proportional to a VCO gain of the VCO and inversely proportional to a chirp current during the chirp phase.

20 Claims, 8 Drawing Sheets

(56) References Cited

U.S. PATENT DOCUMENTS

| | | | |
|---|---|---|---|
| 8,085,097 B2 | 12/2011 | Cloutier et al. | |
| 8,654,006 B2 | 2/2014 | Landez et al. | |
| 8,731,502 B2 | 5/2014 | Salle et al. | |
| 9,515,666 B2 | 12/2016 | Pavao-Moreira et al. | |
| 9,584,177 B2 | 2/2017 | Pavlovic et al. | |
| 10,461,756 B2 * | 10/2019 | Tsutsumi | H03L 7/197 |
| 10,659,062 B2 * | 5/2020 | Yanagihara | H03L 7/197 |
| 2010/0073222 A1 | 3/2010 | Mitomo et al. | |
| 2018/0136328 A1 | 5/2018 | Moss | |
| 2018/0175868 A1 * | 6/2018 | Stuhlberger | H03C 3/095 |
| 2018/0267159 A1 | 9/2018 | Wada et al. | |

OTHER PUBLICATIONS

Notice of Allowance dated Jul. 28, 2021 in U.S. Appl. No. 16/426,623.

* cited by examiner

PHASE PRESET FOR FAST CHIRP PLL

CROSS-REFERENCE TO RELATED APPLICATIONS

This application claims the priority under 35 U.S.C. § 119 of European Patent application no. 18305690.2, filed on 6 Jun. 2018, the contents of which are incorporated by reference herein.

FIELD

This disclosure relates generally to advanced radar systems, and more specifically to fast modulations schemes for a chirp radar while maintaining low phase noise.

BACKGROUND

Next generation radar systems, in particular imaging radar, require the use of ultra-fast chirp modulation to increase radar resolution and at the same time a very low transmitter phase noise to improve target detection. In a radar transceiver, the modulation is normally generated using a frequency synthesizer, or a Phased Locked Loop (PLL), associated with its digital control. To filter out noise contributions from PLL elements (e.g., Voltage Controlled Oscillators, References, and Crystal Controlled Oscillators), the PLL bandwidth is usually set to a relatively low value (e.g., hundreds of kHz). However, a PLL with limited bandwidth is not compatible with a requirement for an advanced radar system's ramp linearity, especially when using very fast chirp modulation schemes.

In one modulation scheme a waveform frequency is ramped between two values during a "chirp" phase, and then returned to the starting frequency during an inter-chirp or "return" phase. During a change from the return phase to the chirp phase, the PLL undergoes a phase jump that can affect the linearity of the first portion of the chirp phase. The usable duration of the chirp phase is thus reduced which limits the advantage of fast chirp modulation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods described herein provide for a fast chirp radar generating a Frequency Modulated Continuous Waveform (FMCW) without the undesirable effects of frequency undershoot (or even PLL unlock), or poor linearity during the chirp phase resulting from the phase change required of the PLL between the return and chirp phases.

By presetting the phase of the PLL during a start frequency time between the return phase and the chirp phase, the linearity of the subsequent chirp is maintained over substantially the entire chirp phase. Accordingly, a gain of the charge pump, and the PLL loop in general, is reduced to a level sufficient for the fast chirp phase, yet at a level where typical noise sources are sufficiently attenuated.

A phase preset current ($I_{PHC}$) is determined that is inversely proportional a chirp current required during the chirp phase and proportional to a VCO gain of a Voltage Controlled Oscillator (VCO). In various embodiments, the phase preset current is injected into various stages of the filter to further improve PLL settling time and reduce the frequency undershoot. Furthermore, in various embodiments, the calibration phase occurs during a startup phase of the PLL. Accordingly, the calibration does not impose any design restrictions regarding noise or power consumption for components that are only active during the chirp phase.

Figure 1:
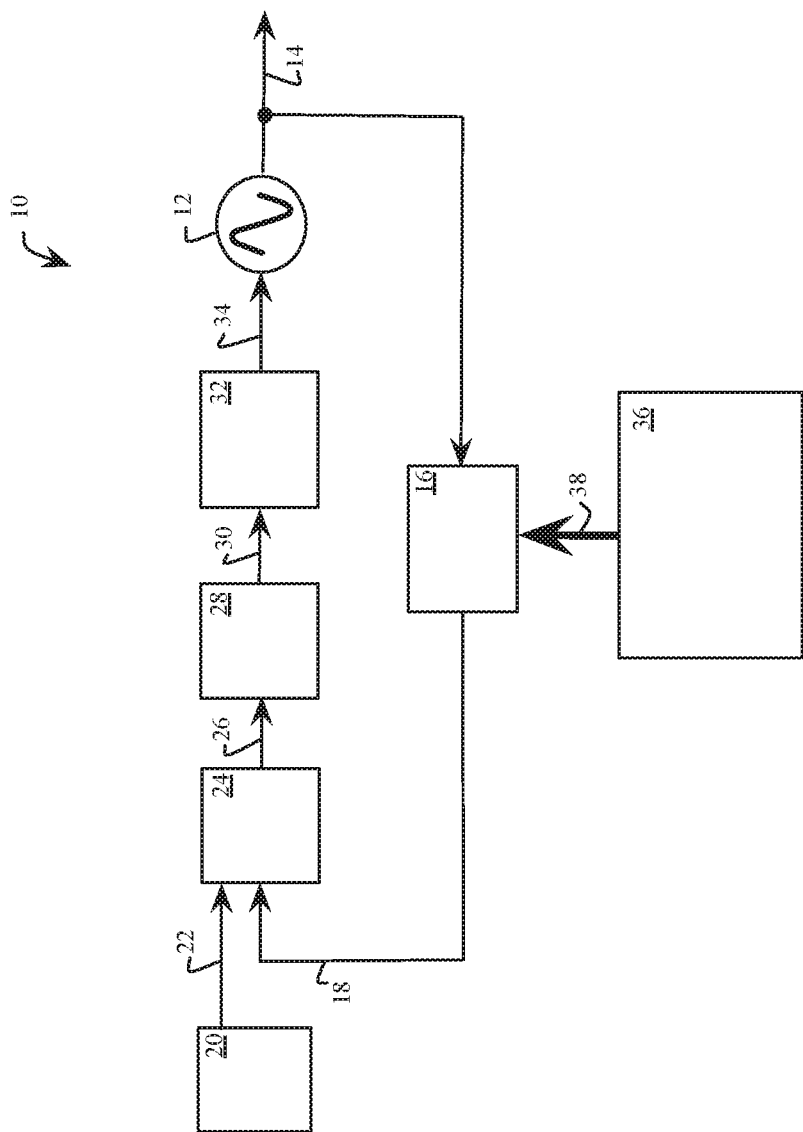
FIG. 1 is a functional block view of a PLL for generating a radar chirp.

FIG. 1 shows an embodiment 10 of PLL for generating a radar chirp. The embodiment 10 includes a VCO 12 for generating a VCO frequency ($F_{VCO}$) 14. The VCO frequency 14 is divided by a frequency divider 16 to generate a divided frequency 18. A reference frequency circuit 20 generates a reference frequency 22. In one embodiment, the reference frequency circuit 20 includes a crystal oscillator followed by a buffer. In another embodiment, the crystal oscillator is replaced with a digital waveform generator.

A phase frequency detector 24 compares the divided frequency 18 with the reference frequency 22 to determine a difference 26. In one embodiment, the difference 26 is a pulse width proportional to a phase difference between the divided frequency 18 and the reference frequency 22. A charge pump 28 generates a charge pump voltage 30 in response to the difference 26. A low pass filter 32 generates a filtered output voltage 34 based on the charge pump voltage 30. The VCO 12 generates the VCO frequency 14 based on the filtered output voltage 34. A digital controller 36 generates control signals 38 to change a division ratio of the frequency divider 16. For example, if the division ratio is ten, the VCO frequency 14 will be generated to have a frequency ten times greater than the reference frequency 22. In one example embodiment, the frequency divider 16 is a cascaded series of D-flip flops, configured to divide the VCO frequency 14 by binary multiples.

Figure 2:
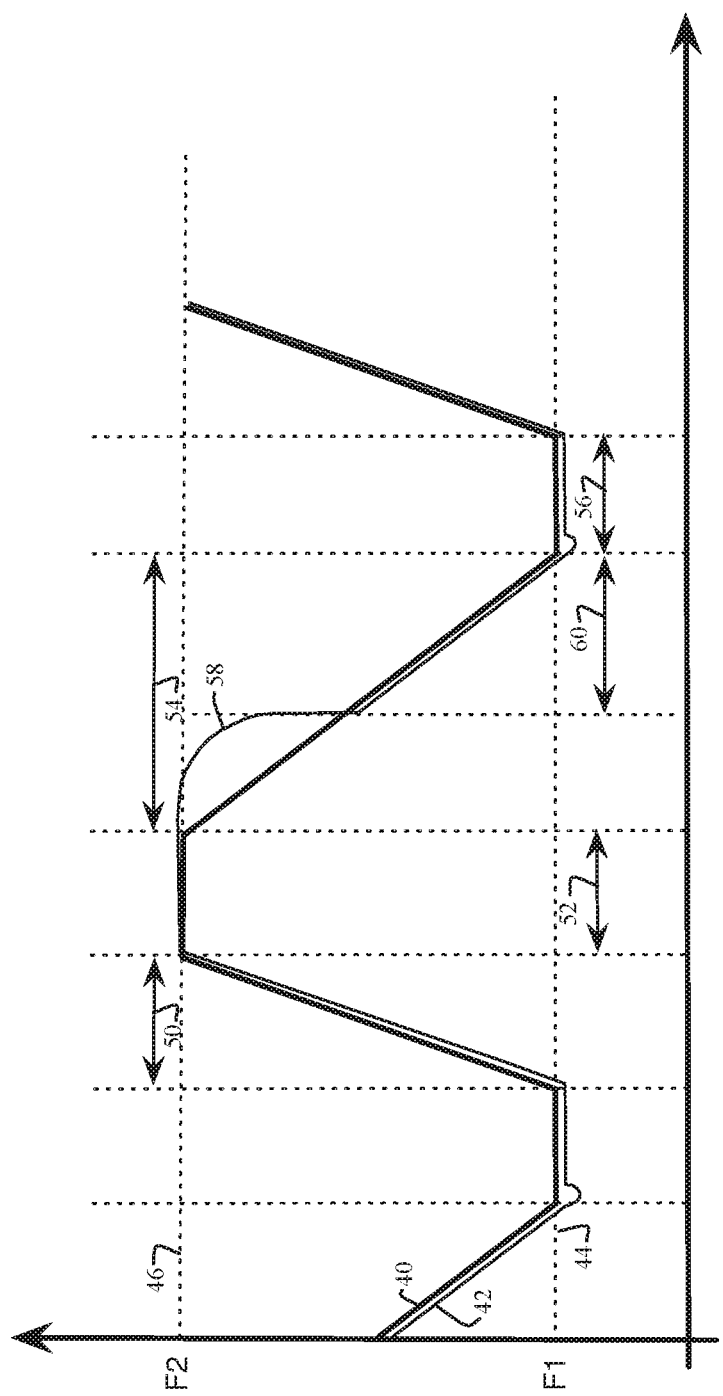
FIG. 2 is a graphical view of a chirp waveform of FIG. 1 showing ideal and actual characteristics.

FIG. 2 is a graphical view comparing an ideal FMCW 40 to an actual FMCW 42 where the frequency undershoot and linearity of the chirp phase are poorly controlled by the embodiment 10 of FIG. 1. The ideal FMCW 40 spans a frequency range from a stop frequency (F1) 44 to a start frequency 46. The FMCW waveforms 40 and 42 consist of a Time Ramp Slope Return ($T_{RSR}$ or "return phase") 50, a stop frequency time (T1) 52, a Time Ramp Slope Data ($T_{RSD}$ or "chirp phase") 54, and a stop frequency time (T2) 56. In the embodiment shown in FIG. 2, the actual FMCW 42 exhibits a frequency undershoot 58 and poor linearity during the chirp phase 54, thus reducing the available chirp time to a usable chirp phase ($T_{RSD2}$) 60.

Figure 3:
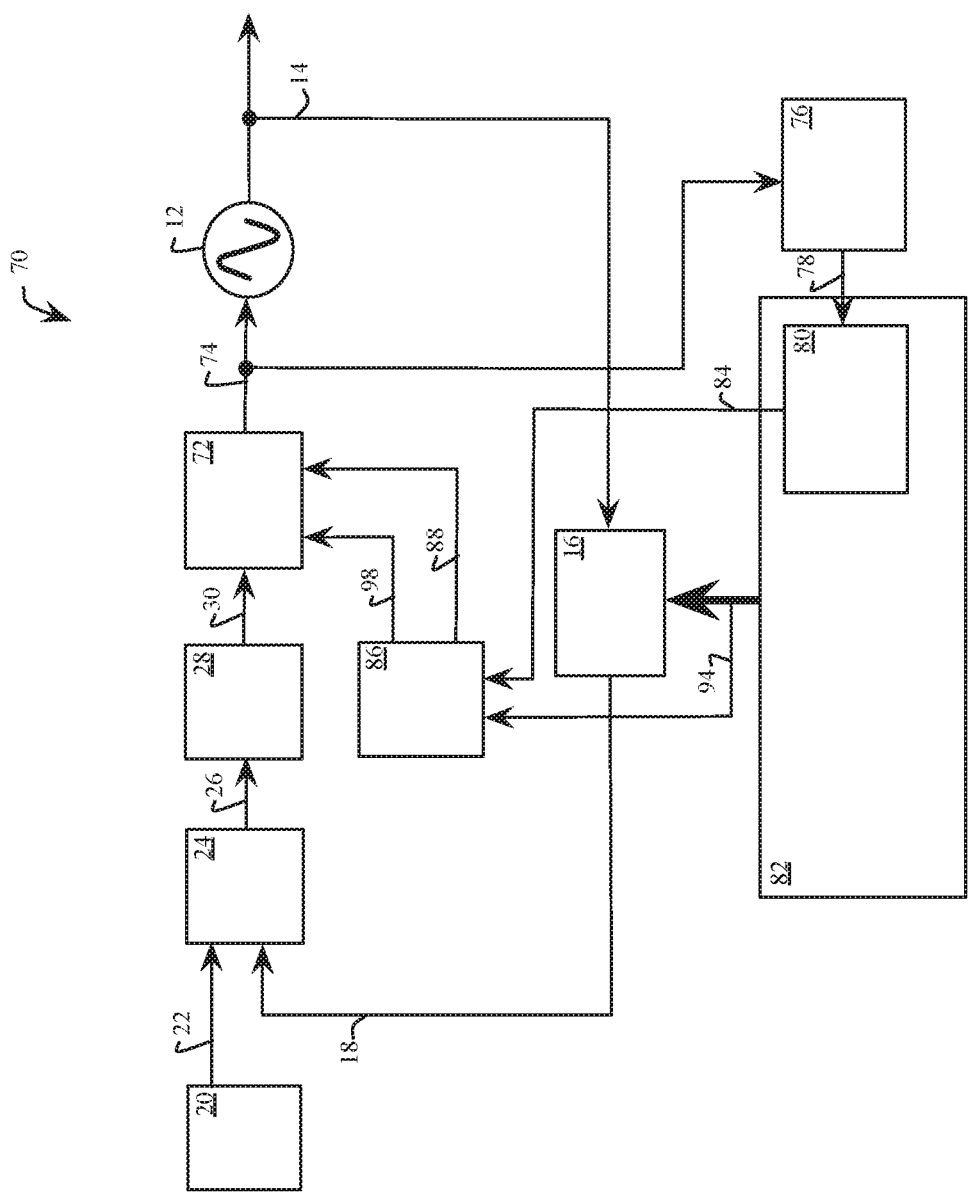
FIG. 3 is a functional block view of a fast chirp PLL accordance with an embodiment of the present disclosure.

Turning now to FIG. 3 with continued reference to FIG. 1, an improved embodiment 70 is described. The embodiment 70 includes a low pass filter 72 configured to receive a phase preset current, described in further detail in FIG. 4. The low pass filter 72 generates a filtered output voltage 74, which controls the VCO 12 and is measured by a measurement circuit 76 to generate a measured value 78. In one embodiment, the measurement circuit 76 determines the measured value 78 during a startup phase of the PLL. In another embodiment, the measurement circuit 76 stores the measured value 78 in a register of a phase preset calibration circuit 80, included in the digital controller 82. In another embodiment, the measured value 78 is calculated periodically, to improve accuracy due to component drift and aging.

The phase preset calibration circuit 80 generates a calibration current control signal provided to the phase preset circuit 86 through a connection 84. In one embodiment, the calibration current is determined during a calibration, and in response to the measurement circuit 76. The phase preset circuit 86 supplies the calibration current over a connection 88 to the low pass filter 72, during the calibration. Following a calibration of the embodiment 70, the digital controller 82 generates a set of phase preset current control signals provided to the phase preset circuit 86 through a connection 94. Following calibration, the phase preset circuit 86 supplies the phase preset current to the low pass filter 72 through a connection 98.

Figure 4:
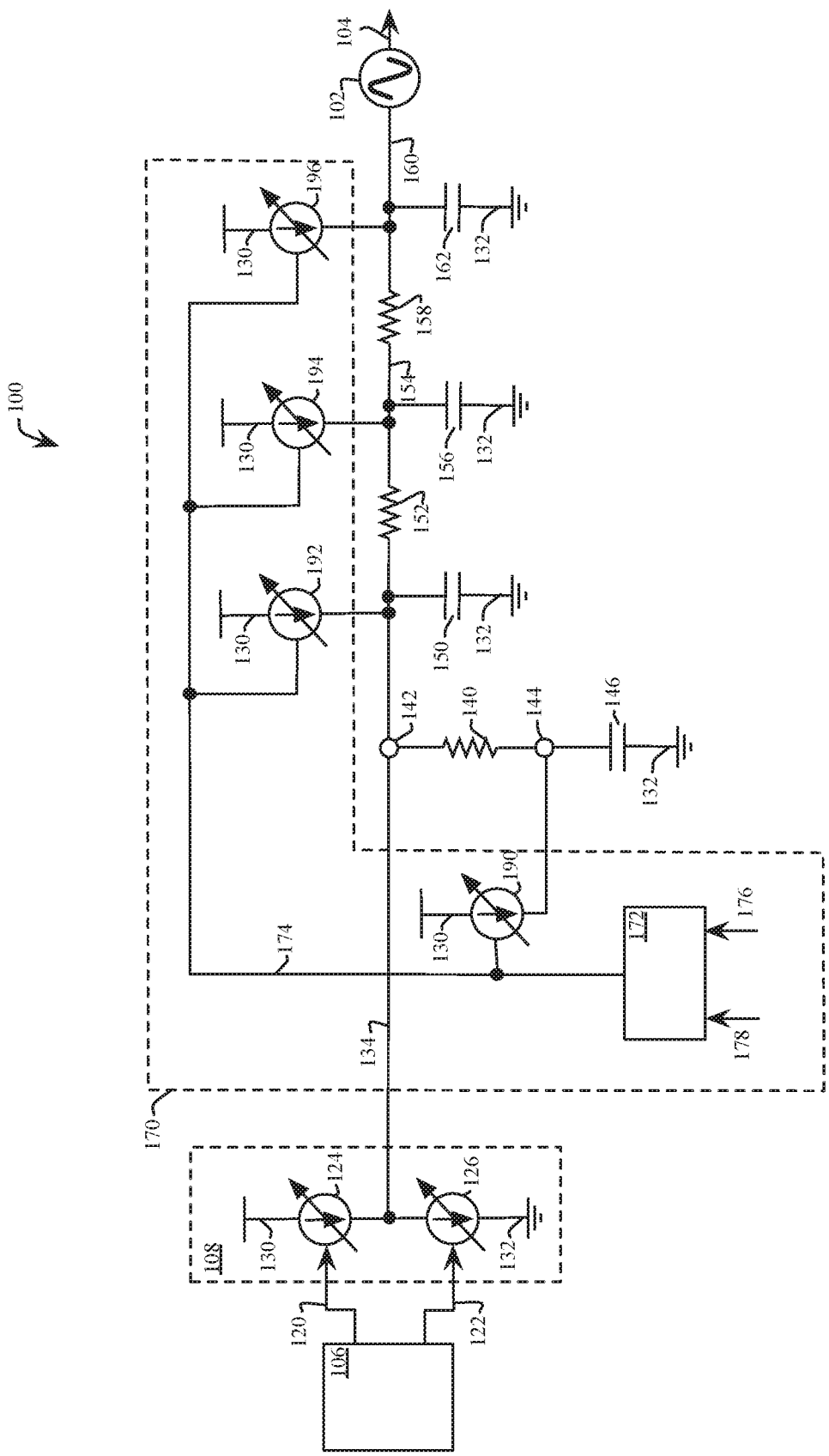
FIG. 4 is a schematic view of a fast chirp PLL in accordance with an embodiment of the present disclosure.

FIG. 4, with reference to FIG. 3, shows additional detail of an embodiment 100 where the connections 88 and 98 of FIG. 3 are combined to carry either the calibration current or the phase preset current. The embodiment 100 includes a VCO 102 configured to generate an FMCW 104. A phase frequency detector 106 provides a charge pump 108 a pair of differential difference signals 120 and 122 that measure a phase difference between a reference frequency and a divided FMCW 104. The differential signals 120 and 122 enable a respective current source 124 and 126, connected in series between a supply rail 130 and a ground 132, to provide a respective positive or negative pulse for the charge pump voltage 134.

The embodiment 100 shows a configuration of resistive and capacitive elements to provide low pass filtering. It should be understood that other numbers and arrangements of components also provide low pass filtering appropriate to the design goals (e.g., bandwidth, and response time), of the PLL. A first resistor 140 is connected between two external pins 142 and 144. A first capacitor 146 is connected between the external pin 144 and the ground 132. In the embodiment 100, the first resistor 140 and the first capacitor 146 are external to an integrated PLL due to their physical size.

A second capacitor 150 is connected between the charge pump voltage 134 and the ground 132. A second resistor 152 is connected between a node 154 and the ground 132. A third capacitor 156 is connected between the node 154 and the ground 132. A third resistor 158 is connected between the filtered output voltage 160 and the node 154. A fourth capacitor 162 is connected between the filtered output voltage 160 and the ground 132.

A group of phase preset related circuits 170 includes a phase preset circuit 172, receiving a phase preset current control signal ($I_{PHC}$) 178 and a calibration current control signal ($I_{CAL}$) 176. The phase preset circuit 172 supplies the calibration current control signal to the node 174 during calibration (e.g., during a startup phase of the PLL), and supplies the phase preset current control signal to the node 174 during a start frequency time preceding the chirp phase. The control signals from the phase preset circuit 172 controls current sources 190, 192, 194 and 196, which supply current to respective capacitors 146, 150, 156 and 162. In other embodiments, the calibration techniques described herein are applied to different loop filter configurations. For example, the loop filter is fully integrated with the other circuits shown in FIG. 3, or the loop filter is external to a monolithic substrate including the other circuits or FIG. 3, or the loop filter is integrated as a multi-chip module or hybrid is the other circuits of FIG. 3. In other embodiments, the PLL includes the charge pump and loop filter with a different type and/or order than shown in FIG. 3, wherein the PLL bandwidth and chirp ramp slope are not correlated.

Figure 5:
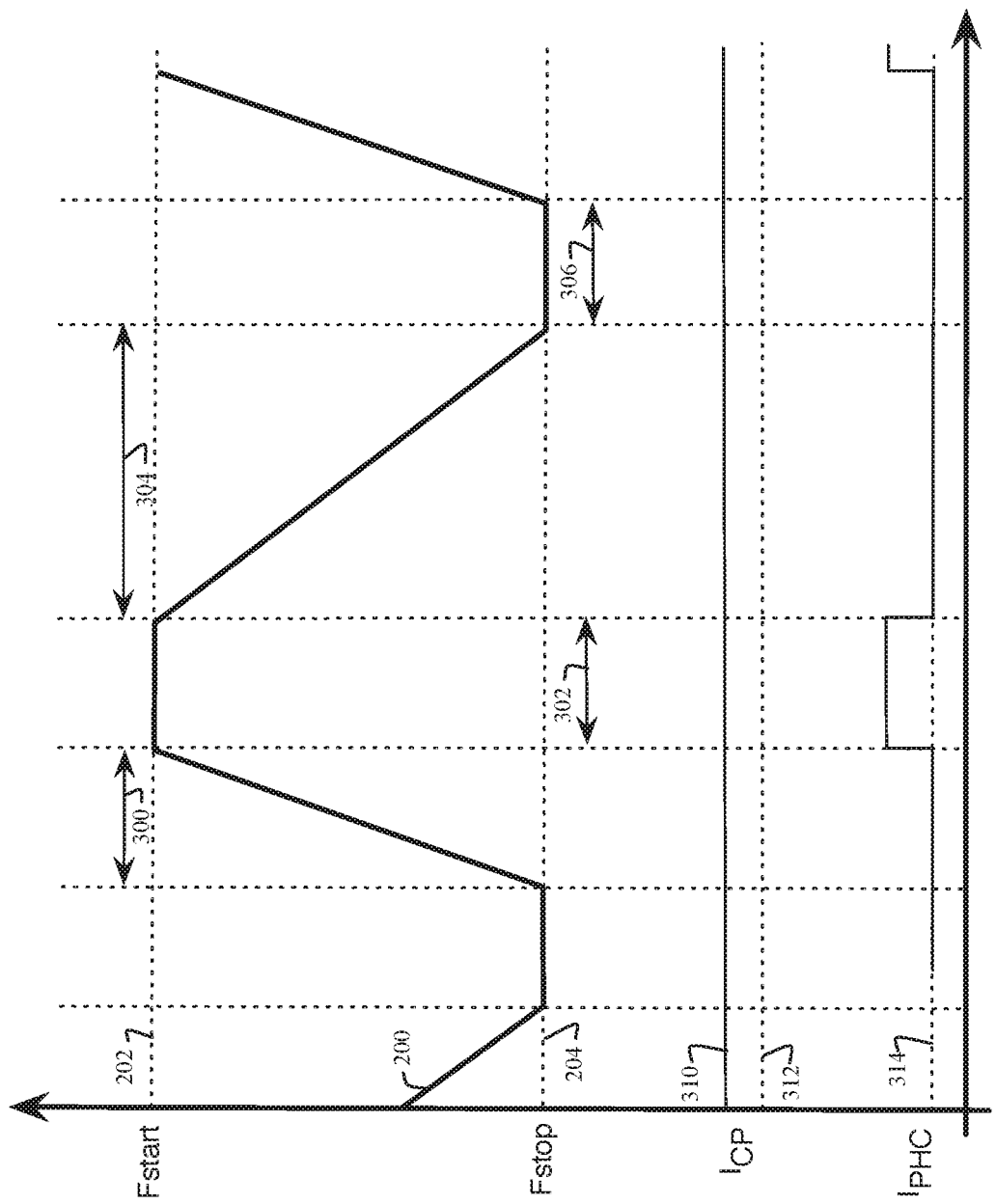
FIG. 5 is a graphical view of waveforms according to the PLL of FIG. 3.

FIG. 5 shows various operational waveforms, for the embodiment 70 of FIG. 3. The FMCW 200 transitions between a start frequency 202 and a stop frequency 204. The FMCW 200 includes a return phase ($T_{RSR}$) 300, a start frequency time (T1) 302, a chirp phase ($T_{RSD}$) 304 and an end frequency time 306. In various embodiments, during the operation of the PLL producing the FMCW 200, the charge pump current ($I_{CP}$) 310 is maintained at a constant level above zero 312. The phase preset current ($I_{PHC}$) 314 is activated during the start frequency time 302 to allow a rapid phase transition of the FMCW between the return phase 300 and the chirp phase 304. The operational waveforms of FIG. 5 show a down-chirp FMCW, where the start frequency 202 is greater than the stop frequency 204. In other embodiments, an up-chirp FMCW is used, where the start frequency 202 is less than the stop frequency 204. In other embodiments, the FMCW chirp has a non-linear shape during the chirp time 304 (e.g., a Frequency Shift Key (FSK) FMCW chirp).

Figure 6:
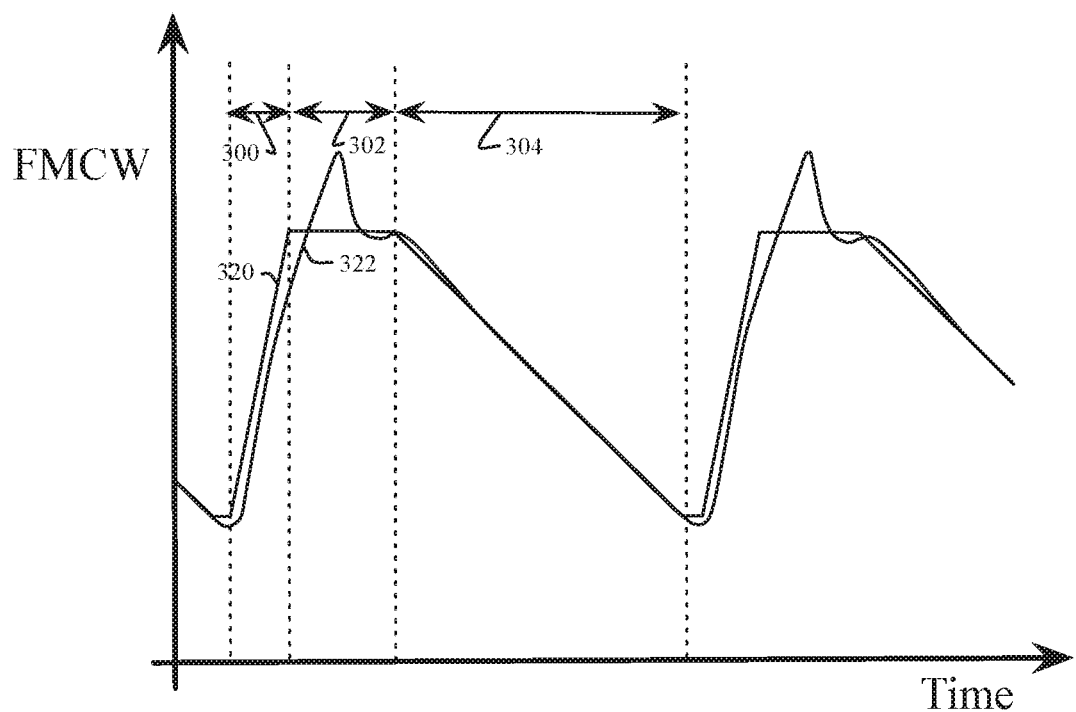
FIG. 6 is a graphical view of a Frequency Modulated Continuous Waveform (FMCW) according to FIG. 3 without supplying a phase preset current to a filter.
Figure 7:
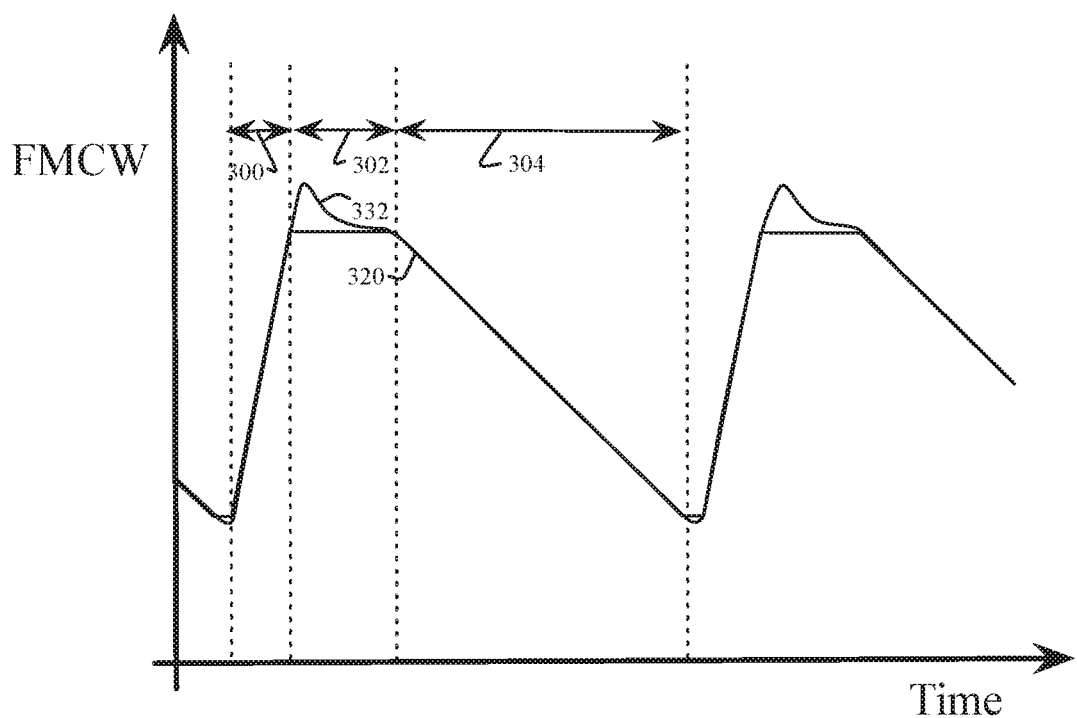
FIG. 7 is a graphical view of a FMCW according to FIG. 3 with a phase preset current supplied to the filter.

FIG. 6 and FIG. 7 compare experimental results with and without the use of the phase preset compensation for the low pass filter of the PLL. Specifically, FIG. 6 shows an ideal FMCW 320 during the return phase 300, the start frequency time 302 and the chirp phase 304. A traditional FMCW 322 shows poor linearity during the first part of the chirp phase 304 as well as a significant frequency overshoot that extends well into the start frequency time 302. In contrast, FIG. 7 shows an FMCW 332 closely tracking the ideal FMCW 320 during the chirp phase 304 when phase preset compensation is applied to the low pass filter of the PLL.

Figure 8:
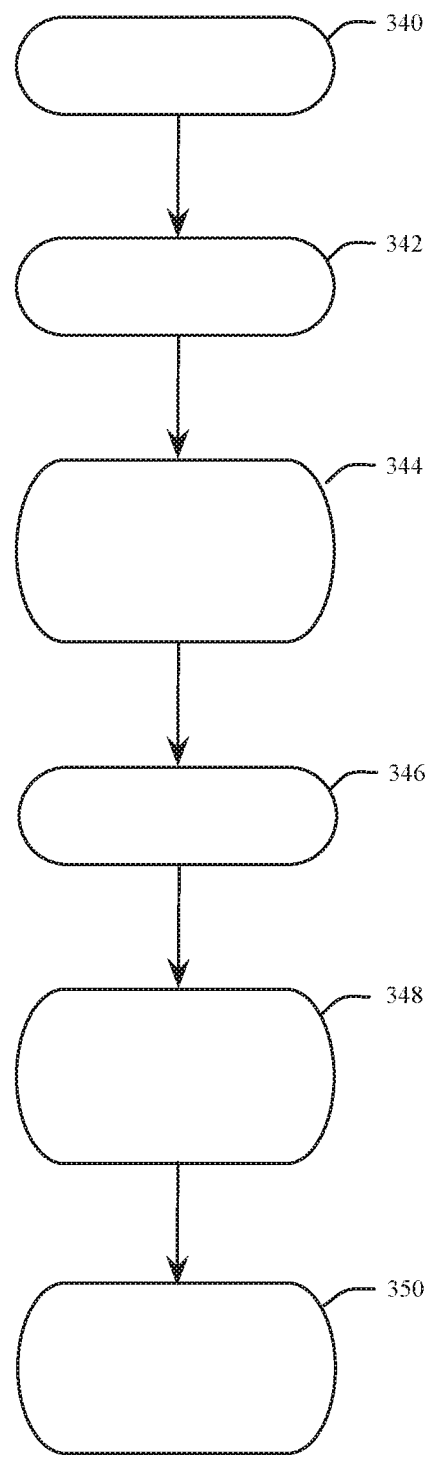
FIG. 8 is a flowchart representation of a method for presetting a phase for a fast chirp PLL in accordance with an embodiment of the present disclosure.

FIG. 8 shows a method for presetting a phase for a fast chirp PLL. With reference to FIG. 3, FIG. 5 and FIG. 8, at 340, an FMCW 14 is generated with a VCO 12. At 342, the FMCW 14 is divided with a frequency divider 16. At 344, a charge pump voltage 30 is generated in response to a difference 26 between a reference waveform 22 and a divided FMCW 18. At 346, the charge pump voltage 30 is filtered with a filter 72. At 348, the frequency divider 16 is modified with a digital controller 82, to generate a chirp phase 304 and a return phase 300. At 350, a phase preset current 98 is supplied to the filter 72 with a phase preset circuit 86, during a start frequency time 302 preceding the chirp phase 304.

Figure 9:
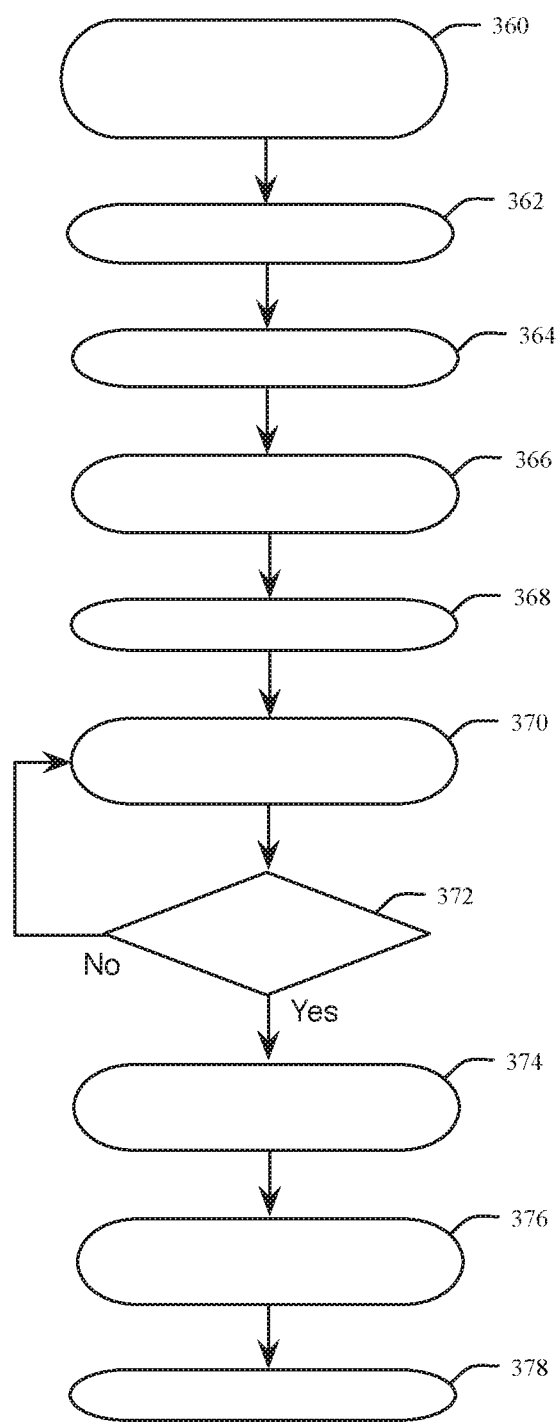
FIG. 9 is a flowchart representation of a method for presetting a phase for a fast chirp PLL in accordance with an embodiment of the present disclosure.

FIG. 9 shows a method for presetting a phase for a fast chirp PLL, wherein a phase preset current supplied during a time preceding the chirp phase is a function of a predetermined current value during a calibration phase. With reference to FIG. 3, FIG. 5 and FIG. 9, at 360, in one example embodiment, values for Fstart 202, Fstop 204, $T_{RSR}$ 300 and $T_{RSD}$ 304 are set in a register included in the phase preset calibration circuit 80. In another embodiment, these values are written into the phase preset calibration circuit 80 through a serial port interface (SPI). In another embodiment, these values are written into the digital controller 82, and are accessible to the phase preset calibration circuit 80. In one embodiment, a counter (CNT_VAL) for a number of clock cycles is also cleared, or set to zero at 360. In other embodiments, the counter is cleared in one of 362, 364, 366 and 368. At 362, the PLL frequency (e.g., FMCW) 14 is set to Fstart 202. At 364, the filtered output voltage 74 is measured by the measurement circuit 76 to determine Vstart. At 366, The PLL frequency 14 is set to Fstop 204 by appropriate selection of the division ratio in the frequency divider 16. At 366, the filtered output voltage 74 is measured again with the measurement circuit 76 to determine Vstop. At 368, the charge pump 28 is disabled.

At 370, a calibration current ($I_{CAL}$) 88 is supplied to the filter 72 and the counter is incremented. At 372, if the filtered output voltage 74 equals (or exceeds) the Vstart value, corresponding to the FMCW 14 equaling Fstart 202, the method proceeds to 374, otherwise the method returns to 370. At 374, an elapsed time (dT) is calculated as the counter value (e.g., number of clock cycles) multiplied by the clock period (Tclk). At 376, the phase preset current ($I_{PHC}$) is calculated to be equal to the calibration current ($I_{CAL}$), multiplied by the elapsed time (dT), divided by the duration of the chirp phase ($T_{RSD}$) 304. In various embodiments, the calculation of the elapsed time and the phase preset current is calculated with a circuit in the digital controller 82. In another embodiment, the calculation of the elapsed time and the phase preset current is calculated with software and registers in the digital controller 82. At 378, the charge pump 28 is reactivated, so that chirp transmission can subsequently occur.

As will be appreciated, embodiments as disclosed include at least the following. In one embodiment, a fast chirp Phase Locked Loop (PLL) with phase preset comprises a Voltage Controlled Oscillator (VCO) configured to generate a Frequency Modulated Continuous Waveform (FMCW). The VCO is responsive to a filtered output voltage of a filter connected to a charge pump. The charge pump is responsive to a difference between a reference frequency waveform and a divided frequency waveform generated by a frequency divider configured to divide the FMCW. A digital controller is connected to the frequency divider and is configured to modify a division ratio of the frequency divider to generate a chirp phase and a return phase. The chirp phase includes a first linear change of the FMCW from a start frequency to a stop frequency. The return phase includes a second linear change of the FMCW from the stop frequency to the start frequency. A phase preset circuit is connected to the digital controller and the filter. The phase preset circuit supplies a phase preset current during a start frequency time preceding the chirp phase. The phase preset current is proportional to a VCO gain of the VCO and inversely proportional to a chirp current during the chirp phase.

Alternative embodiments of the fast chirp Phase Locked Loop (PLL) with phase preset include one of the following features, or any combination thereof. The phase preset current is determined by a calibration circuit including a counter configured to determine a number of clock cycles elapsed during a change from the stop frequency to the start frequency by measuring the filtered output voltage, storing the number of clock cycles in the digital controller and controlling the phase preset circuit with the digital controller to supply the phase preset current. The phase preset current is determined by multiplying a calibration current, supplied by the phase preset circuit to the filter, by the number of clock cycles, multiplied by a clock period, and divided by a duration of the return phase. The phase preset current is determined during a startup phase of the PLL. The filter is a low pass filter comprising a plurality of filter stages. The phase preset current is distributed to each of the plurality of filter stages. The FMCW is a down-chirp waveform, wherein the start frequency is greater than the stop frequency. Without the phase preset current, the PLL has a reduction in a usable chirp phase.

In another embodiment, a method for presetting a phase of a fast chirp Phase Locked Loop (PLL) comprises generating a Frequency Modulated Continuous Waveform (FMCW) with a Voltage Controlled Oscillator (VCO). The VCO responds to a filtered output voltage. The FMCW is divided with a frequency divider to generate a divided frequency waveform. A charge pump voltage is generated in response to a difference between a reference frequency waveform and the divided frequency waveform. The charge pump voltage is filtered with a filter, to generate the filtered output voltage. A digital controller modifies a division ratio of the frequency divider to generate a chirp phase and a return phase. The chirp phase includes a first linear change of the FMCW from a start frequency to a stop frequency. The return phase includes a second linear change of the FMCW from the stop frequency to the start frequency. A phase preset circuit supplies a phase preset current to the filter during a start frequency time preceding the chirp phase, wherein the phase preset current is proportional to a VCO gain of the VCO and inversely proportional to a chirp current during the chirp phase.

Alternative embodiments of the method for a method for presetting a phase of a fast chirp Phase Locked Loop (PLL) include one of the following features, or any combination thereof. The phase preset current is determined by counting, with a calibration circuit, a number of clock cycles elapsed during a change from the stop frequency to the start frequency by measuring the filtered output voltage, storing the number of clock cycles in the digital controller and controlling the phase preset circuit with the digital controller to supply the phase preset current. The phase preset current is determined by multiplying a calibration current, supplied by the phase preset circuit to the filter, by the number of clock cycles, multiplied by a clock period, and divided by a duration of the chirp phase. The phase preset current is determined during a startup phase of the PLL. Filtering the charge pump voltage comprises filtering with a low pass fitter comprising a plurality of filter stages. The phase preset current is distributed to each of the plurality of filter stages. The phase preset circuit is controlled with the digital controller during the start frequency time. The bandwidth of the PLL is limited to minimize a phase noise.

In another embodiment, a method for presetting a phase of a fast chirp Phase Locked Loop (PLL) comprises generating a Frequency Modulated Continuous Waveform (FMCW) with the PLL. The PLL includes a low pass filter configured to generate a filtered output voltage by filtering a charge pump voltage of a charge pump. The charge pump is responsive to a difference between a divided FMCW and a reference frequency waveform. The FMCW includes a chirp phase and a return phase. The chirp phase includes a first linear change of the FMCW from a start frequency to a stop frequency. The return phase includes a second linear change of the FMCW from the stop frequency to the start frequency. A phase preset current is supplied to the low pass filter during a start frequency time preceding the chirp phase, wherein determining the phase preset current comprises: measuring a start voltage from the filtered output voltage while an FMCW frequency is equal to the start frequency, setting the FMCW frequency to the stop frequency, wherein the filtered output voltage equals a stop voltage, disabling the charge pump, supplying a calibration current to the low pass filter, and counting a number of clock cycles elapsed during a change from the stop voltage to the start voltage, wherein each clock cycle has a clock period, setting the phase preset current equal to the calibration current multiplied by the number of clock cycles, multiplied by the clock period, and divided by a duration of the chirp phase, and enabling the charge pump, and supplying the phase preset current during a subsequent start frequency time.

Alternative embodiments of the method for presetting a phase of a fast chirp Phase Locked Loop (PLL) include one of the following features, or any combination thereof. The phase preset current is determined during a startup phase. The calibration current is supplied to the low pass filter during a startup phase, and the phase preset current is supplied to the low pass filter during the start frequency time. Without the phase preset current, the PLL has a reduction in a usable chirp time.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A fast chirp Phase Locked Loop, PLL, with phase preset comprising:
    a Voltage Controlled Oscillator, VCO, configured to generate a Frequency Modulated Continuous Waveform, FMCW, the VCO responsive to a filtered output voltage of a filter connected to a charge pump, the charge pump responsive to a difference between a reference frequency waveform and a divided frequency waveform generated by a frequency divider configured to divide the FMCW;
    a digital controller connected to the frequency divider and configured to modify a division ratio of the frequency divider to generate a chirp phase and a return phase, the chirp phase including a first linear change of the FMCW from a start frequency to a stop frequency, and the return phase including a second linear change of the FMCW from the stop frequency to the start frequency; and
    a phase preset circuit connected to the digital controller and the filter, the phase preset circuit supplying a phase preset current during a start frequency time preceding the chirp phase, the phase preset current proportional to a VCO gain of the VCO and inversely proportional to a chirp current during the chirp phase.

2. The PLL of claim 1 wherein the phase preset current is determined by a calibration circuit including a counter configured to determine a number of clock cycles elapsed during a change from the stop frequency to the start frequency by measuring the filtered output voltage, storing the number of clock cycles in the digital controller and controlling the phase preset circuit with the digital controller to supply the phase preset current.

3. The PLL of claim 2 wherein the phase preset current is determined by multiplying a calibration current, supplied by the phase preset circuit to the filter, by the number of clock cycles, multiplied by a clock period, and divided by a duration of the chirp phase.

4. The PLL of claim 1 wherein the filter is a low pass filter comprising a plurality of filter stages.

5. The PLL of claim 4 wherein the phase preset current is distributed to each of the plurality of filter stages.

6. A method for presetting a phase of a fast chirp Phase Locked Loop, PLL, comprising:
    generating a Frequency Modulated Continuous Waveform, FMCW, with a Voltage Controlled Oscillator, VCO, the VCO responding to a filtered output voltage;
    dividing the FMCW, with a frequency divider, to generate a divided frequency waveform;
    generating a charge pump voltage in response to a difference between a reference frequency waveform and the divided frequency waveform;
    filtering the charge pump voltage with a filter, to generate the filtered output voltage;
    modifying, with a digital controller, a division ratio of the frequency divider to generate a chirp phase and a return phase, the chirp phase including a first linear change of the FMCW from a start frequency to a stop frequency, and the return phase including a second linear change of the FMCW from the stop frequency to the start frequency; and
    supplying, with a phase preset circuit, a phase preset current to the filter during a start frequency time preceding the chirp phase, wherein the phase preset current is proportional to a VCO gain of the VCO and inversely proportional to a chirp current during the chirp phase.

7. The method of claim 6 further comprising determining the phase preset current by counting, with a calibration circuit, a number of clock cycles elapsed during a change from the stop frequency to the start frequency by measuring the filtered output voltage, storing the number of clock cycles in the digital controller and controlling the phase preset circuit with the digital controller to supply the phase preset current.

8. The method of claim 7 further comprising determining the phase preset current by multiplying a calibration current, supplied by the phase preset circuit to the filter, by the number of clock cycles, multiplied by a clock period, and divided by a duration of the chirp phase.

9. The method of claim 6 wherein filtering the charge pump voltage comprises filtering with a low pass filter comprising a plurality of filter stages.

10. The method of claim 9 further comprising distributing the phase preset current to each of the plurality of filter stages.

11. The method of claim 6, wherein determining the phase preset current comprises measuring a start voltage from the filtered output voltage while an FMCW frequency is equal to the start frequency.

12. The method of claim 11, wherein determining the phase preset current further comprises setting the FMCW frequency to the stop frequency, wherein the filtered output voltage equals a stop voltage.

13. The method of claim 12, wherein determining the phase preset current further comprises counting a number of clock cycles elapsed during a change from the stop voltage to the start voltage, wherein each clock cycle has a clock period.

14. A method for presetting a phase of a fast chirp Phase Locked Loop, PLL, comprising:

generating a Frequency Modulated Continuous Waveform, FMCW, with the PLL, the PLL including a low pass filter configured to generate a filtered output voltage by filtering a charge pump voltage of a charge pump, the charge pump responsive to a difference between a divided FMCW and a reference frequency waveform, the FMCW including a chirp phase and a return phase, the chirp phase including a first linear change of the FMCW from a start frequency to a stop frequency, and the return phase including a second linear change of the FMCW from the stop frequency to the start frequency; and supplying a phase preset current to the low pass filter during a start frequency time preceding the chirp phase, wherein determining the phase preset current comprises:

measuring a start voltage from the filtered output voltage while an FMCW frequency is equal to the start frequency, setting the FMCW frequency to the stop frequency, wherein the filtered output voltage equals a stop voltage, disabling the charge pump, supplying a calibration current to the low pass filter, and counting a number of clock cycles elapsed during a change from the stop voltage to the start voltage, wherein each clock cycle has a clock period, setting the phase preset current equal to the calibration current multiplied by the number of clock cycles, multiplied by the clock period, and divided by a duration of the chirp phase, and enabling the charge pump, and supplying the phase preset current during a subsequent start frequency time.

15. The method of claim 14 further comprising supplying the calibration current to the low pass filter during a startup phase, and supplying the phase preset current to the low pass filter during the start frequency time.

16. The method of claim 14, wherein filtering the charge pump voltage comprises filtering with the low pass filter comprising a plurality of filter stages.

17. The method of claim 16, further comprising distributing the phase preset current to each of the plurality of filter stages.

18. The method of claim 14, wherein the divided FMCW is generated by a frequency divider.

19. The method of claim 18, further comprising modifying a division ratio of the frequency divider to generate the chirp phase.

20. The method of claim 19, wherein modifying the division ratio of the frequency divider further comprises modifying the division ratio of the frequency divider to generate the return phase.

* * * * *